(12) United States Patent
Horiguchi

(10) Patent No.: US 6,661,232 B1
(45) Date of Patent: Dec. 9, 2003

(54) ELECTRIC POTENTIAL SENSOR AND ELECTRONIC APPARATUS USING THE SAME

(75) Inventor: Chikahiro Horiguchi, Toyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 130 days.

(21) Appl. No.: 09/663,216

(22) Filed: Sep. 15, 2000

(30) Foreign Application Priority Data

Sep. 16, 1999 (JP) .......................... 11-262378

(51) Int. Cl.[7] .................. G01R 29/12; G01R 29/22; H01L 41/04
(52) U.S. Cl. ................ 324/457; 324/72.5; 324/109; 310/319
(58) Field of Search ................ 324/457, 458, 324/72, 613, 622, 109, 675, 760, 72.5; 73/504.16, 514.34; 310/311, 317, 318, 319

(56) References Cited

U.S. PATENT DOCUMENTS

| | | | | |
|---|---|---|---|---|
| 4,031,866 A | * | 6/1977 | Asano | 123/32 |
| 4,613,228 A | * | 9/1986 | Suzuki et al. | 324/457 |
| 4,720,682 A | * | 1/1988 | Ikushima et al. | 324/458 |
| 4,724,393 A | * | 2/1988 | Kumada et al. | 324/458 |
| 4,936,405 A | * | 6/1990 | Hrovat | 180/197 |
| 5,388,458 A | * | 2/1995 | Weinberg et al. | 73/505 |
| 5,600,251 A | * | 2/1997 | Akiyama | 324/613 |
| 5,986,456 A | * | 11/1999 | Yamashita | 324/457 |
| 6,316,942 B1 | * | 11/2001 | Horiguchi | 324/457 |

* cited by examiner

Primary Examiner—Anjan K. Deb
(74) Attorney, Agent, or Firm—Keating & Bennett, LLP

(57) ABSTRACT

An electric potential sensor comprises a tuning fork having two legs; a detecting electrode provided on one leg of the tuning fork so as to face a surface of which an electric potential is to be detected; a driving piezoelectric member provided on at least one leg of the tuning fork; and feedback piezoelectric members respectively provided on both legs of the tuning fork.

10 Claims, 6 Drawing Sheets

ELECTRIC POTENTIAL SENSOR AND ELECTRONIC APPARATUS USING THE SAME

BACKGROUND OF THE INVENTION

1. Field of the Invention

The present invention relates to an electric potential sensor and an electronic apparatus using the same, and more particularly to an electric potential sensor employing a piezoelectric tuning fork and an electronic apparatus using the same.

2. Description of the Related Art

In an electronic apparatus such as an electrophotographic copying machine or a laser printer, a photosensor drum must be electrified to a desired level. To this end, an electric potential sensor is used to perform non-contact measuring of the surface potential of the photosensor drum.

FIG. 5 is a block diagram of a conventional electric potential sensor. As shown in FIG. 5, an electric potential sensor 1 is provided with a piezoelectric tuning fork 2', an oscillation circuit 9, pre-amplifier 10, an amplifier 11, a detecting circuit 12, a low-pass filter 13, a DC amplifier 14, and an output terminal 15. The piezoelectric tuning fork 2' comprises a tuning fork 2 having two legs 3 and 4 (generally made of a metal), a driving piezoelectric member 5 provided on one of the legs 3, and a feedback piezoelectric member 6 provided on the other leg 4. A detecting electrode 7 is provided on the leg 3 opposedly facing a surface 8 to be detected, and a capacitance C1 is formed between the detecting electrode 7 and the surface 8. The surface 8 indicates, for example, the surface of the photosensor drum.

An output from the oscillation circuit 9 is connected to the driving piezoelectric member 5, and the feedback piezoelectric member 6 is connected to an input of the oscillation circuit 9.

The detecting electrode 7 is connected, through the pre-amplifier 10 and the amplifier 11, to the synchronous detecting circuit 12. The output of the feedback piezoelectric member 6 is also connected to the synchronous detecting circuit 12. The output from the synchronous detecting circuit 12 is connected to the output terminal 15 via the low-pass filter 13 and the DC amplifier 14.

FIGS. 6A to 6D show the waveforms of the signal in respective parts of the electric potential sensor 1 described above. An operation of the electric potential sensor 1 is explained with reference to FIGS. 5 and 6.

When the signal generated by the oscillation circuit 9 is applied to the driving piezoelectric member 5 provided on one leg 3 of the tuning fork 2, the driving piezoelectric member 5 mechanically vibrates to cause the piezoelectric tuning fork 2 to vibrate in a reverse-phase mode in which the two legs of the tuning fork 2 vibrate 180° out of phase—that is, as the left leg 3 moves to the left, the right leg 4 moves to the right and vice versa. When the piezoelectric tuning fork 2 vibrates, the feedback piezoelectric member 6 on leg 4 vibrates mechanically and outputs an electrical signal indicative of the frequency, phase and magnitude of the vibration of leg 4. The electrical signal is fed back to the oscillation circuit 9 to form a closed loop comprising the oscillation circuit 9, the driving piezoelectric member 5 and the feedback piezoelectric member 6. This feedback circuit causes self-oscillation to occur at a desired frequency.

When the tuning fork 2 vibrates, the distance between the detecting electrode 7 and the surface 8 (and along with it the capacitance C1) changes as a function of the vibration of the tuning fork 2. The signal output from the detecting electrode 7 changes in accordance with both the change in capacitance C1 and the electrical potential of the surface 8 to be detected. Particularly, the frequency of the output signal varies as a function of the vibration of the tuning fork 2 and the amplitude of the output signal varies substantially proportionally with any change in the electrical potential of the surface 8. The signal output from the detecting electrode 7 is amplified by the pre-amplifier 10 and the amplifier 11 and is input into the synchronous detecting circuit 12. FIG. 6A shows the sinusoidal waveform of the signal $V_{out}$ output from the detecting electrode 7 and input to the detecting circuit 12.

The signal output from the feedback piezoelectric member 6 is also input to the synchronous detecting circuit 12 as a reference signal. The signal input from the amplifier 11 is synchronously detected by cross correlating it with the reference signal. As shown in FIG. 6B, the signal output from the feedback piezoelectric member 6 is a sine wave having the same frequency and phase as the signal output from the detector electrode 7. The difference between these signals is their amplitude (the amplitude of the output of amplifier 11 changing as a function of the amplitude of the change on the surface b). FIG. 6C shows the waveform of the signal output from the detecting circuit 12. The signal output from the detecting circuit 12 is preferably a signal which is formed by full-wave rectification of the cross correlated signals input to the detecting circuit 12.

The DC component in the signal detected by the detecting circuit 12 is extracted by the low-pass filter 13, and the signal is amplified by the DC amplifier 14 to be output from the output terminal 15. This signal, shown in FIG. 6D, is substantially proportional to the potential of the surface 8.

Due to external factors, the piezoelectric tuning fork will sometimes include unwanted vibration components which are not in reverse-phase with each other. A typical vibration component of this type is an in-phase vibration component wherein the two legs of turning fork 2 move in unison (in-phase). FIG. 7A to 7D show the waveforms of respective parts of the piezoelectric tuning fork 2 when a non-reverse-phase vibration components having a frequency different from the vibration in the reverse-phase mode component is added to the tuning fork 2 in a conventional electric potential sensor.

In the electric potential sensor 1, when the piezoelectric tuning fork 2 vibrates with non-reverse-phase components in addition to reverse-phase components, a signal (FIG. 7A) is output from the synchronous detecting electrode 7 and is then input to the detecting circuit 12. This signal has a waveform in which two or more sine waves having different waveforms are combined. The synchronous detecting circuit also receives the reference signal (FIG. 7B) generated by the feedback piezoelectric member 6. This signal also has a waveform in which non-reverse-phase vibrations are added to reverse-phase vibrations. As described above, this signal has the same waveform and phase (but a different magnitude) as the signal output from the detecting electrode 7.

In the detecting circuit 12, a signal from amplifier 11 which has both reverse-phase mode and non-reverse-phase mode components is cross correlated with the reference signal from piezoelectric member 6 having the same phase in which the vibration in the reverse phase mode is added to the in-phase mode. FIG. 7C shows the waveform of the signal output from the detecting circuit 12. This signal is formed by full-wave rectification of the signal input to the detecting circuit 12.

The DC component in the signal detected by the detecting circuit 12 is extracted by the low-pass filter 13, amplified by the DC amplifier 14 and output to the output terminal 15. FIG. 7D shows the waveform of the signal output from the output terminal 15. As described above, a DC voltage having the predetermined value is output from the output terminal 15. By comparing the voltage value of the signal in FIG. 7D with that in FIG. 6D, it can be seen that the signal output from the output terminal 15 is larger for the case in which the non-reverse-phase mode vibration is added to the reverse-phase mode vibration.

As described above, the conventional electric potential sensor 1 has had a problem that the signal output by the sensor becomes unstable when the non-reverse-phase mode component of vibration is applied to the piezoelectric tuning fork 2 by external factors.

SUMMARY OF THE INVENTION

It is therefore an object of the present invention is to provide an electric potential sensor that can stabilize the signal to be output even when the non-reverse-phase mode component of vibration is applied to the piezoelectric tuning fork by external factors, and an electronic apparatus using the same.

In order to accomplish the above object, according to the present invention, a detector electrode is provided on one leg of a piezoelectric tuning fork having two legs opposedly facing a surface to be detected, a driving piezoelectric member is provided on at least one leg of the tuning fork, and a feedback piezoelectric member respectively provided on both legs of the tuning fork.

In addition, the electric potential sensor according to the present invention comprises an oscillation circuit for outputting a signal to be input to the driving piezoelectric member, and an adder or a subtractor for adding or subtracting the signal output from the feedback piezoelectric members provided on respective legs of the tuning fork to feedback to the oscillation circuit.

Furthermore, the electric potential sensor according to the present invention comprises a detecting circuit for synchronously detecting the signal output from the detecting electrode by the signal output from the adder or the subtractor.

Furthermore, an electronic apparatus according to the present invention comprises a photosensor drum and an electric potential sensor for measuring the surface potential of the photosensor drum.

By being constituted as described above, the electric potential sensor according to the present invention can stabilize the signal to be output even when a non-reverse-phase mode component of vibration is applied to tuning fork.

Moreover, in the electronic apparatus according to the present invention, the surface potential of the photosensor drum can be kept at a predetermined value even when a vibration in the non-reverse-phase mode is applied to the electronic apparatus.

In the electric potential sensor according to the present invention, an electrode for detecting is provided on one leg of a tuning fork having two legs opposedly facing a surface to be detected, one or more driving piezoelectric members are provided on at least one of the legs, and at least one feedback piezoelectric member is provided on each of the legs. The electric potential sensor also has an oscillation circuit for outputting a signal to be input to the driving piezoelectric members, an adder or a subtractor for adding or subtracting the output signal from the feedback piezoelectric members provided on-opposite legs of the tuning fork to output a signal which is fed back to the oscillation circuit, and a detecting circuit for synchronously detecting the signal output from the detecting electrode to the reference signal output by the adder or the subtractor. Thereby, even if the vibration in the non-reverse-phase mode is added to the piezoelectric tuning fork by external factors, the output signal is stabilized.

Moreover, in the electronic apparatus of the present invention, the photosensor drum and the potential sensor for measuring the surface potential are provided thereon. Thereby, even if the vibration in the non-reverse-phase mode is applied to the apparatus by the external factors, the surface potential of the drum can be held at the predetermined value.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

Other features and advantages of the present invention will become apparent from the following description of the invention which refers to the accompanying drawings.

DETAILED DESCRIPTION OF EMBODIMENTS OF THE INVENTION

Hereinafter, the preferred embodiments of the present invention are explained in detail with reference to the drawings.

Figure 1:
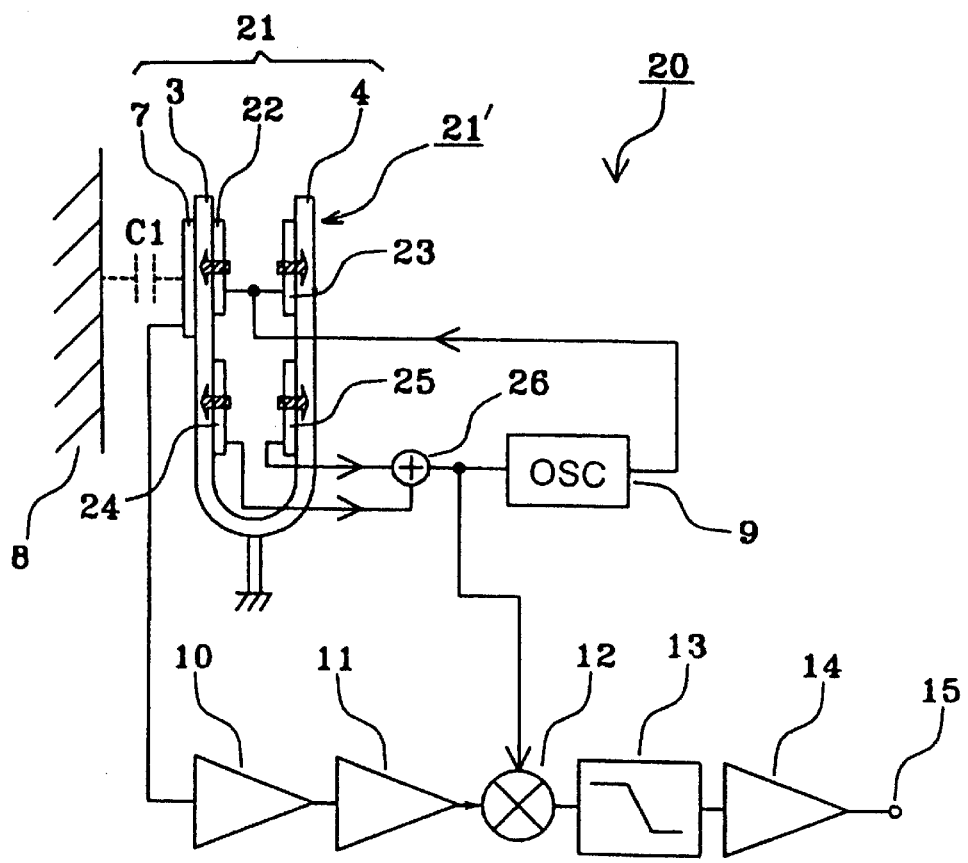
FIG. 1 is a block diagram showing an embodiment of an electric potential sensor according to the present invention.
Figure 5:
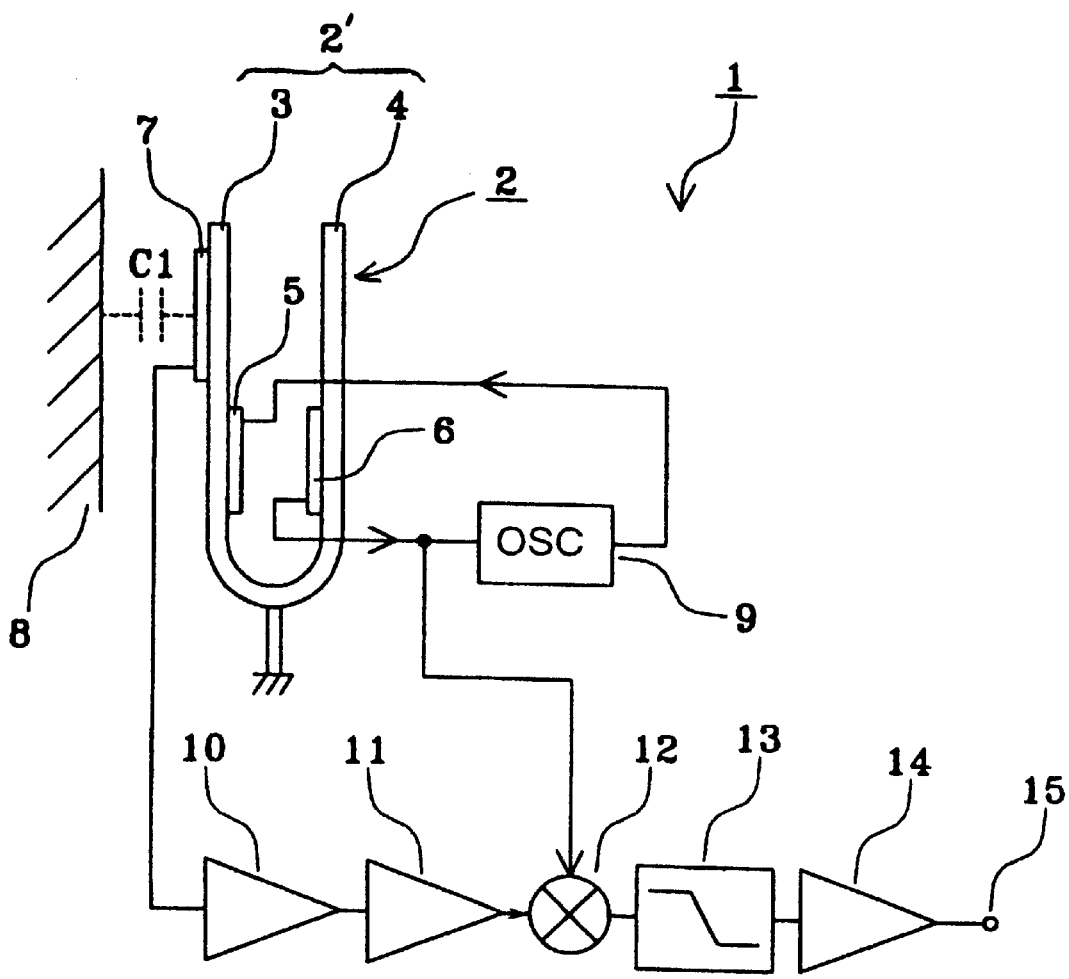
FIG. 5 is a block diagram showing a conventional electric potential sensor.

FIG. 1 is a block diagram of an embodiment according to the present invention. In FIG. 1, parts which are the same as or similar to those in FIG. 5 are given the same reference numerals and an explanation thereof is omitted.

As shown in FIG. 1, an electric potential sensor 20 comprises a piezoelectric tuning fork 21, an adder circuit 26, oscillator 9, amplifiers 10 and 11, sensor 7, synchronous detector 12, low pass filter 13 and amplifier 14. The piezoelectric tuning fork 21 includes tuning fork 21' having a pair of driving piezoelectric members 22 and 23 and a pair of feedback piezoelectric members 24 and 25 formed thereon. The driving piezoelectric member 22 and the feedback piezoelectric member 24 are provided on one leg 3 of the tuning fork 21' and the driving piezoelectric member 23 and the feedback piezoelectric member 25 are provided on the other leg 4 of the tuning fork 21'. The driving piezoelectric members 22 and 23 and the feedback piezoelectric members 24 and 25 are polarized in the same direction. That is, they are all polarized in a direction from their respective top surface towards their surface which is in contact with the tuning fork 21', as indicated by arrows in FIG. 1. Furthermore, the feedback piezoelectric members 24 and 25 are connected to respective inputs of adder 26 and the output of the adder 26 is connected to an oscillation circuit 9 and a synchronous detecting circuit 12. The output of the oscillation circuit 9 is connected to both of the driving piezoelectric members 22 and 23.

FIGS. 2A to 2F show the waveforms of the signals in respective parts of the electric potential sensor 20 whose operation will be explained with reference to FIGS. 1 and 2.

Since the driving piezoelectric members 22 and 23 are polarized in the same direction, the tuning fork 21' vibrates in a reverse-phase mode in response to the signal output from the oscillation circuit 9. When the tuning fork 21' vibrates only in the reverse-phase mode, a signal having a frequency and phase which is in phase with the reverse-phase mode vibration of tuning fork 21' is output from a detecting electrode 7, as in the case of the conventional electric potential sensor 1, and is input into the detecting circuit 12 via a pre-amplifier 10 and an amplifier 11. Moreover, a signal which is in phase with the output of detecting electrode 7 is output from the feedback piezoelectric members 24 and 25 since they are polarized in the same direction.

Signals from the two feedback piezoelectric members 24 and 25 are input to adder 26 and are summed. Since the input signals have the same phase as one another, they intensify each other, and a signal having a reverse-mode vibration frequency and phase is output from adder 26. The signal output from adder 26 is input to detecting circuit 12 as a reference signal to be synchronously detected (cross-correlated) with the signal input from the amplifier 11 to the detecting circuit 12. The DC component of the signal detected by the synchronous detecting circuit 12 (i.e., the signal output by the synchronous detecting circuit 12) is extracted by the low-pass filter 13, amplified by the DC amplifier 14 and output to the output terminal 15.

Figure 2A:
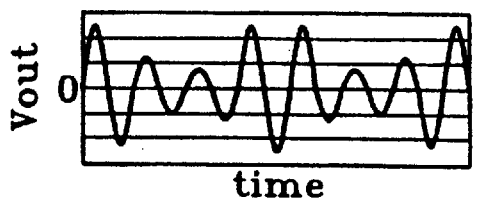
FIGS. 2A to 2F are graphs showing signals at respective parts of the electric potential sensor shown in FIG. 1.
Figure 2B:
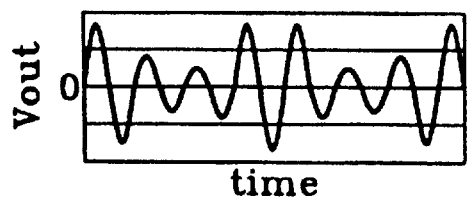
Figure 2C:
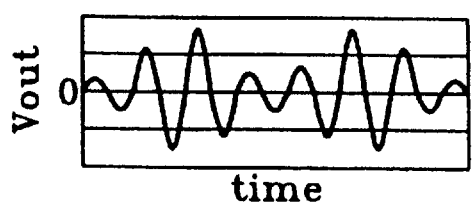

If non-reverse-phase components of vibration are added to the tuning fork 21' by external factors, as shown in FIG. 2A, a signal having both reverse-phase and non-reverse-phase components is output from detecting electrode 7, just as in the case of the conventional electric potential sensor 1, and is input into the detecting circuit 12 via the pre-amplifier 10 and the amplifier 11. In a similar manner, signals having waveforms in which non-reverse-phase vibration components are added to the normal reverse-phase vibration components are output from the feedback piezoelectric members 24 and 25. Since the feedback piezoelectric members 24 and 25 are provided on different legs of the tuning fork 21, the non-reverse-phase components of the vibrations of the tuning fork 21 are converted into electrical signals (FIGS. 2B and 2C, respectively) output by the feedback piezoelectric members 24 and 25. The electrical signals are 180° out of phase with one another.

Figure 2D:
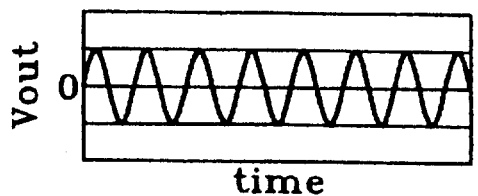

The signals output from the feedback piezoelectric members 24 and 25 are input into the adder 26. The reverse-phase components of the two signals have the same phase and are added to one another. However, since the non-reverse-phase components of the output signals are 180° out of phase with one another, they cancel each other. As a result, a signal representing only the reverse-phase mode vibration component is output from the adder 26, as shown in FIG. 2D.

Figure 2E:
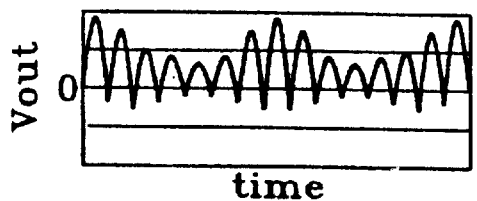

The signal output from the adder 26 is input as a reference signal into the detecting circuit 12, and the signal input from the amplifier 11 is synchronously detected. FIG. 2E shows the waveform of the signal output from the detecting circuit 12.

Figure 2F:
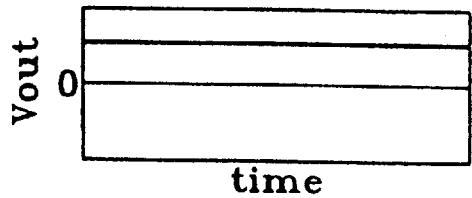
Figure 6A:
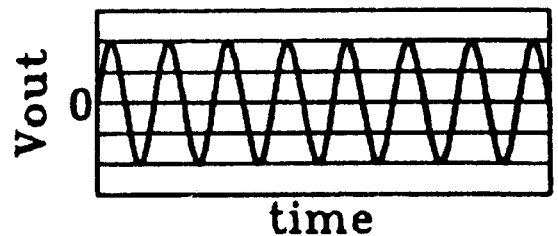
FIGS. 6A to 6D are graphs showing signals at respective parts of the electric potential sensor in FIG. 5.
Figure 6B:
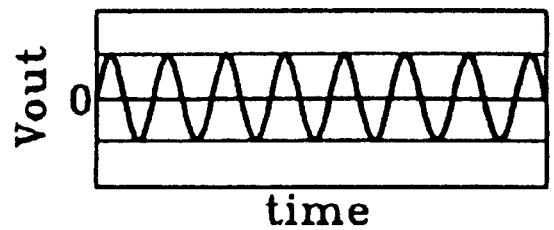
Figure 6C:
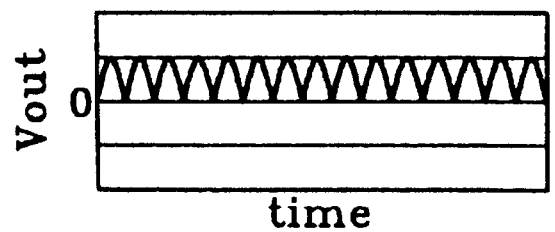
Figure 6D:
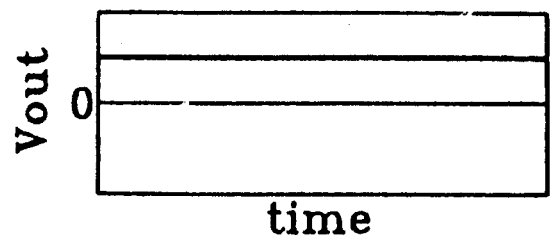
Figure 7A:
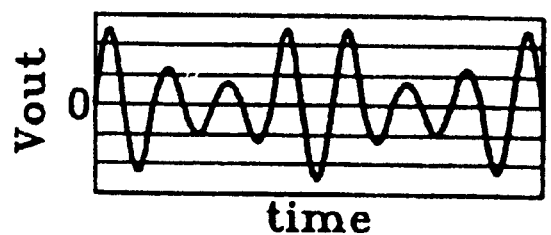
FIGS. 7A to 7D are graphs showing signals at respective parts of the electric potential sensor in FIG. 5 in which a tuning fork vibrates under a reverse-phase mode.
Figure 7B:
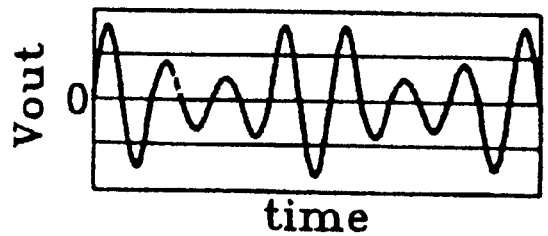
Figure 7C:
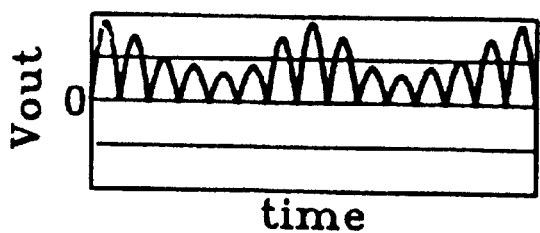
Figure 7D:
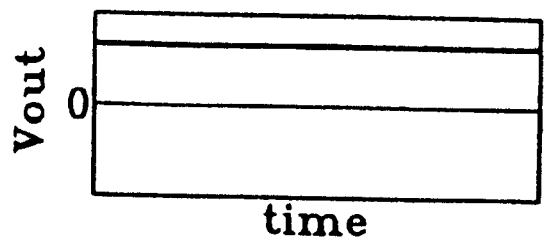

The DC component in the signal detected by the detecting circuit 12 is extracted by the low-pass filter 13, and the signal is amplified by the DC amplifier 14 to be output to the output terminal 15. FIG. 2F shows the waveform of the signal output from the output terminal 15. By comparing the voltage amplitude of the signal in FIG. 2F with that in FIG. 6D and FIG. 7D, it can be seen that the signal in FIG. 2F has the almost same voltage value as in the case where non-reverse-phase mode components of vibration are not added to the reverse-phase mode vibrations.

As described above, in the electric potential sensor 20, the stability of the output signal is prevented from deteriorating by removing the factors caused by non-reverse-phase components of vibration of the tuning fork 21 from the reference signal.

In the electric potential sensor 20 described above, the signals output from the feedback piezoelectric members 24 and 25 are connected to the adder 26 and the output thereof is connected to both the oscillation circuit 9 and the synchronous detecting circuit 12. Alternatively, the signals output from the feedback piezoelectric members 24 and 25 may be directly connected to the oscillation circuit 9 and the synchronous detecting circuit 12 without using the adder 26. In this case, the same effect as in the case of using the adder 26 can be obtained.

Figure 3:
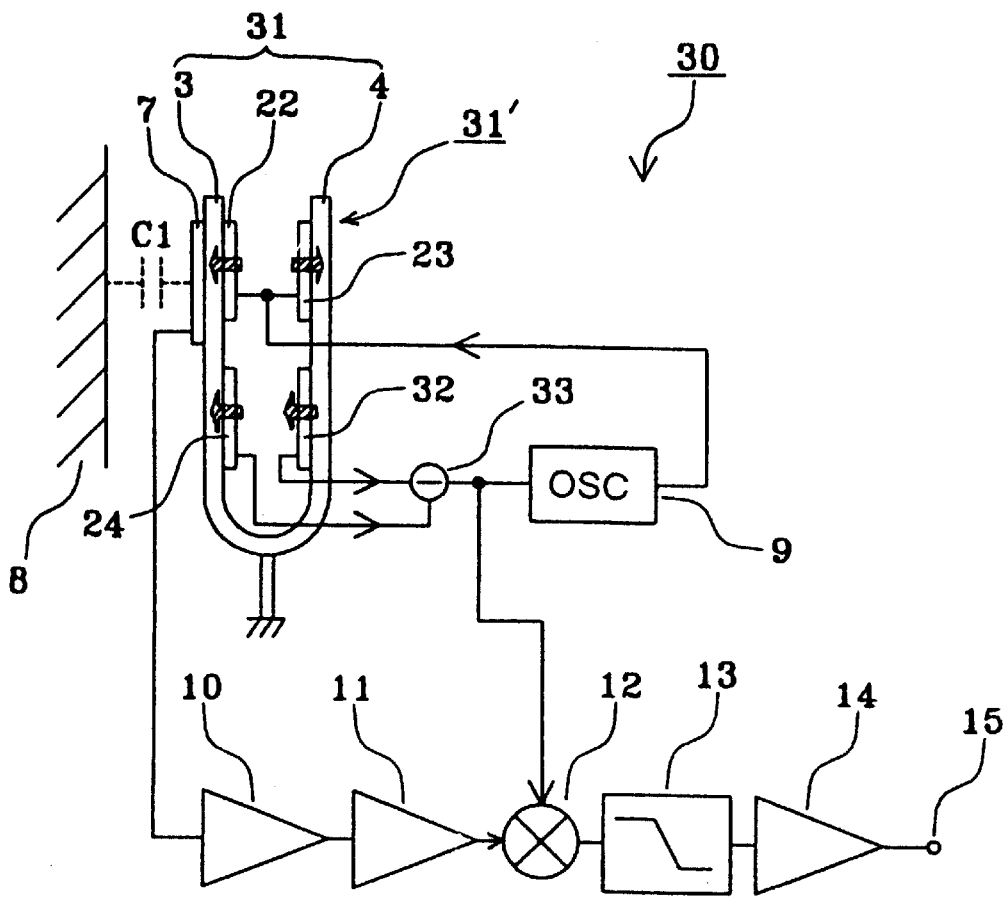
FIG. 3 is a block diagram showing another embodiment of the electric potential sensor according to the present invention.

FIG. 3 shows a block diagram of another embodiment according to the present invention. In FIG. 3, the same parts as in FIG. 1 are given the same symbols and an explanation thereof is omitted.

In FIG. 3, in an electric potential sensor 30, a feedback piezoelectric member 32, instead of the feedback piezoelectric member 25, is provided on leg 4 of a tuning fork 31'. The feedback piezoelectric member 32 is polarized in a direction opposite to the piezoelectric members 24 and 25. The polarizing directions are indicated by arrows in FIG. 3. The feedback piezoelectric members 24 and 32 are connected to the input of a subtractor 33, and the output from the subtractor 33 is connected to the oscillation circuit 9 and the detecting circuit 12.

Since the feedback piezoelectric members 24 and 32 are polarized in opposite directions, the reverse-phase mode components of vibration of the output signals are generated out of phase, and the components of vibration are output in-phase with each other from the two feedback piezoelectric members 24 and 32. However, since the subtractor 33 is used instead of the adder 26, the components of the signals corresponding to the non-reverse-phase mode vibrations are cancelled, and the signal output from the subtractor 33 corresponds only to the reverse-phase mode components of vibration. As a result, in the sensor 30, the same effect as in the electric potential sensor 20 can be obtained.

In the electric potential sensor 30, unlike the electric potential sensor 20, the outputs from the feedback piezoelectric members 24 and 32 may not be connected directly to the oscillation circuit 9.

While the feedback piezoelectric members 22 and 23 are provided on both legs 3 and 4 of the tuning forks 21' and 31', it is possible to provide the driving piezoelectric members on only one of the legs. In that case, the same effects as the case where the driving piezoelectric members are provided on both legs are obtained.

Figure 4:
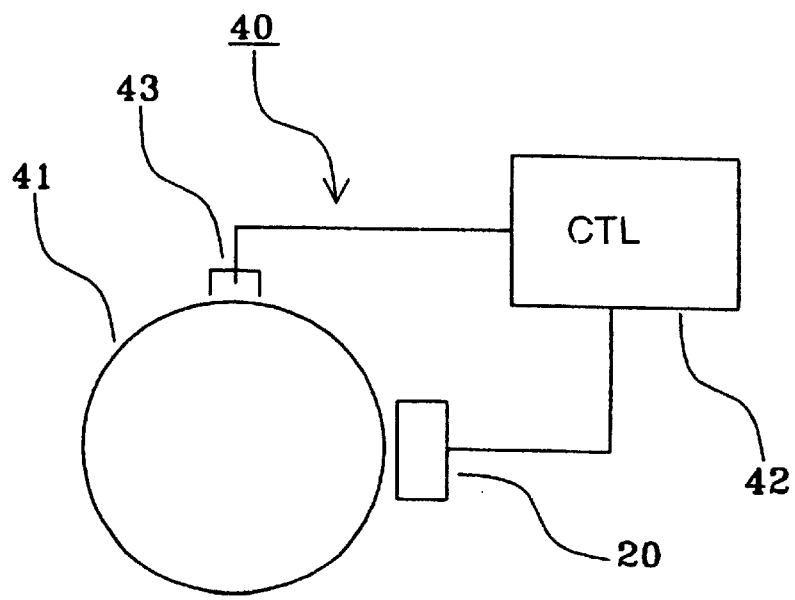
FIG. 4 is a block diagram showing an electronic apparatus of one embodiment according to the present invention.

FIG. 4 shows a block diagram of an embodiment of an electronic apparatus according to the present invention. In FIG. 4, an electronic apparatus 40 has a photosensor drum 41, a control circuit 42, a corotron 43, and the electric potential sensor 20 according to the present invention. In this case, the corotron 43 and the electric potential sensor 20 are placed close to the photosensor drum and are connected to the control circuit 42.

In the electronic apparatus 40 constituted above, the photosensor drum 41 is charged by the corotron controlled by the control circuit 42. The surface potential of the photosensor drum 41 is detected by the electric potential sensor 20, and is fed back to the control circuit 42. The control circuit 42 adjusts the voltage applied to the corotron so that the surface potential of the photosensor drum 41 detected by the electric potential sensor 20 can be a predetermined value. At this time, in the electric potential sensor 20 according to the present invention, even if the vibration in the in-phase mode is applied to the piezoelectric . tuning fork by external factors, since the output signal is stable, the surface potential of the photosensor drum 41 can be measured with accuracy.

As a result, in the electronic apparatus 40, even if the vibration in the in-phase mode is applied to the apparatus by external factors, the surface potential of the photosensor drum 41 can be held at the predetermined value.

In the electronic apparatus 40, although the surface of the photosensor drum 41 is measured by using the electric potential sensor 20, the electric potential sensor 30 may be used. In this case, the same effects can be obtained.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electric potential sensor comprising:
   a tuning fork having first and second legs;
   a detecting electrode provided on one leg of the tuning fork so as to face a surface of which an electric potential is to be detected;
   at least one driving piezoelectric member, said at least one driving piezoelectric member being provided on at least one leg of the tuning fork; and
   at least first and second feedback piezoelectric members, each of the legs of the tuning fork having at least one of the feedback piezoelectric members provided thereon.

2. The electric potential sensor according to claim 1 further comprising:
   an oscillation circuit for generating a signal to be input to the at least one driving piezoelectric member; and
   an adder for adding the signals output from the feedback piezoelectric members for feedback to said oscillating circuit.

3. The electric potential sensor according to claim 2 further comprising:
   a detecting circuit for synchronously detecting the signal output from said detecting electrode with the signal output from the adder.

4. The electric potential sensor according to claim 1 further comprising:
   an oscillation circuit for generating a signal to be input to the at least one driving piezoelectric member; and
   a subtractor for subtracting a signal output from at least one feedback piezoelectric member located on the first leg from a signal output from at least one feedback piezoelectric member located on the second leg to output a signal which is fed back to the oscillating circuit.

5. The electric potential sensor according to claim 4 further comprising:
   a detecting circuit for synchronously detecting the signal output from said detecting electrode with the signal output from the subtractor.

6. An electronic apparatus comprising:
   a photosensor drum; and
   an electric potential sensor comprising:
      a tuning fork having first and second legs;
      a detecting electrode provided on one leg of the tuning fork so as to face a surface of said photosensor drum of which an electric potential is to be detected;
      at least one driving piezoelectric member, each of the driving piezoelectric members being provided on at least one leg of the tuning fork; and
      at least first and second feedback piezoelectric members, each of the legs of the tuning fork having at least one of the feedback piezoelectric members provided thereon.

7. The electric apparatus according to claim 6, wherein electric potential sensor further comprises:
   an oscillation circuit for generating a signal to be input to the at least one driving piezoelectric member; and
   an adder for adding the signals output from the feedback piezoelectric members for feedback to said oscillating circuit.

8. The electronic apparatus according to claim 7, wherein the electronic potential sensor further comprises:
   a detecting circuit for synchronously detecting the signal output from said detecting electrode with the signal output from the adder.

9. The electronic apparatus according to claim 6, wherein the electronic potential sensor further comprises:
   an oscillation circuit for generating a signal to be input to the at least one driving piezoelectric member; and
   a subtractor for subtracting signals output from at least one feedback piezoelectric member located on the first leg from signals output from at least one feedback piezoelectric member located on the second leg to output a signal which is fed back to the oscillating circuit.

10. The electronic apparatus according to claim 9, wherein the electronic potential sensor further comprises:
   a detecting circuit for synchronously detecting the signal output from said detecting electrode with the signal output from the subtractor.

* * * * *